(12) United States Patent
Nakano et al.

(10) Patent No.: US 8,972,822 B2
(45) Date of Patent: Mar. 3, 2015

(54) MEMORY MODULE AND SEMICONDUCTOR STORAGE DEVICE

(71) Applicant: Fujitsu Limited, Kawasaki-shi, Kanagawa (JP)

(72) Inventors: Rikizo Nakano, Kawasaki (JP); Osamu Ishibashi, Kawasaki (JP); Sadao Miyazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 233 days.

(21) Appl. No.: 13/675,265

(22) Filed: Nov. 13, 2012

(65) Prior Publication Data

US 2013/0145233 A1 Jun. 6, 2013

(30) Foreign Application Priority Data

Dec. 1, 2011 (JP) ................................ 2011-263311

(51) Int. Cl.
| | |
|---|---|
| G11C 29/00 | (2006.01) |
| G01R 31/28 | (2006.01) |
| G11C 7/00 | (2006.01) |
| G11C 11/406 | (2006.01) |
| G11C 5/04 | (2006.01) |

(52) U.S. Cl.
CPC ............ *G11C 11/40618* (2013.01); *G11C 5/04* (2013.01)
USPC ........... 714/763; 714/710; 714/723; 365/200; 365/185.09; 365/185.11

(58) Field of Classification Search
USPC .......... 714/710, 718, 723, 763, 6.1, 6.13, 6.2, 714/6.32, 42, 52; 365/200, 201, 185.09, 365/185.11, 230.03, 230.05
See application file for complete search history.

(56) References Cited

U.S. PATENT DOCUMENTS

| | | | |
|---|---|---|---|
| 4,667,325 A | | 5/1987 | Kitano et al. |
| 5,841,785 A | * | 11/1998 | Suzuki .......................... 714/718 |
| 8,443,263 B2 | * | 5/2013 | Selinger et al. ............... 714/768 |
| 8,531,882 B2 | * | 9/2013 | Fujimura et al. ......... 365/185.09 |
| 8,593,899 B2 | * | 11/2013 | Ide ........................... 365/230.01 |

FOREIGN PATENT DOCUMENTS

| | | |
|---|---|---|
| JP | 59-161744 A | 9/1984 |
| JP | 64-76341 A | 3/1989 |
| JP | 3-282652 A | 12/1991 |
| JP | 4-279949 A | 10/1992 |
| JP | 2004-206615 A | 7/2004 |
| KR | 1020020001877 A | 1/2002 |
| KR | 10-0785821 | 12/2007 |
| WO | 98/45130 A1 | 10/1998 |

OTHER PUBLICATIONS

Korean Office Action application No. 10-2012-0136789 dated Jan. 28, 2014.

* cited by examiner

*Primary Examiner* — Christine Tu
(74) *Attorney, Agent, or Firm* — Squire Patton Boggs (US) LLP

(57) ABSTRACT

A memory module includes a plurality of memory chips stacked on top of one another, each of the plurality of memory chips including a memory cell unit that is divided into a plurality of blocks, and an address scrambling circuit that processes an input address signal and that selects a block to be operated.

6 Claims, 9 Drawing Sheets

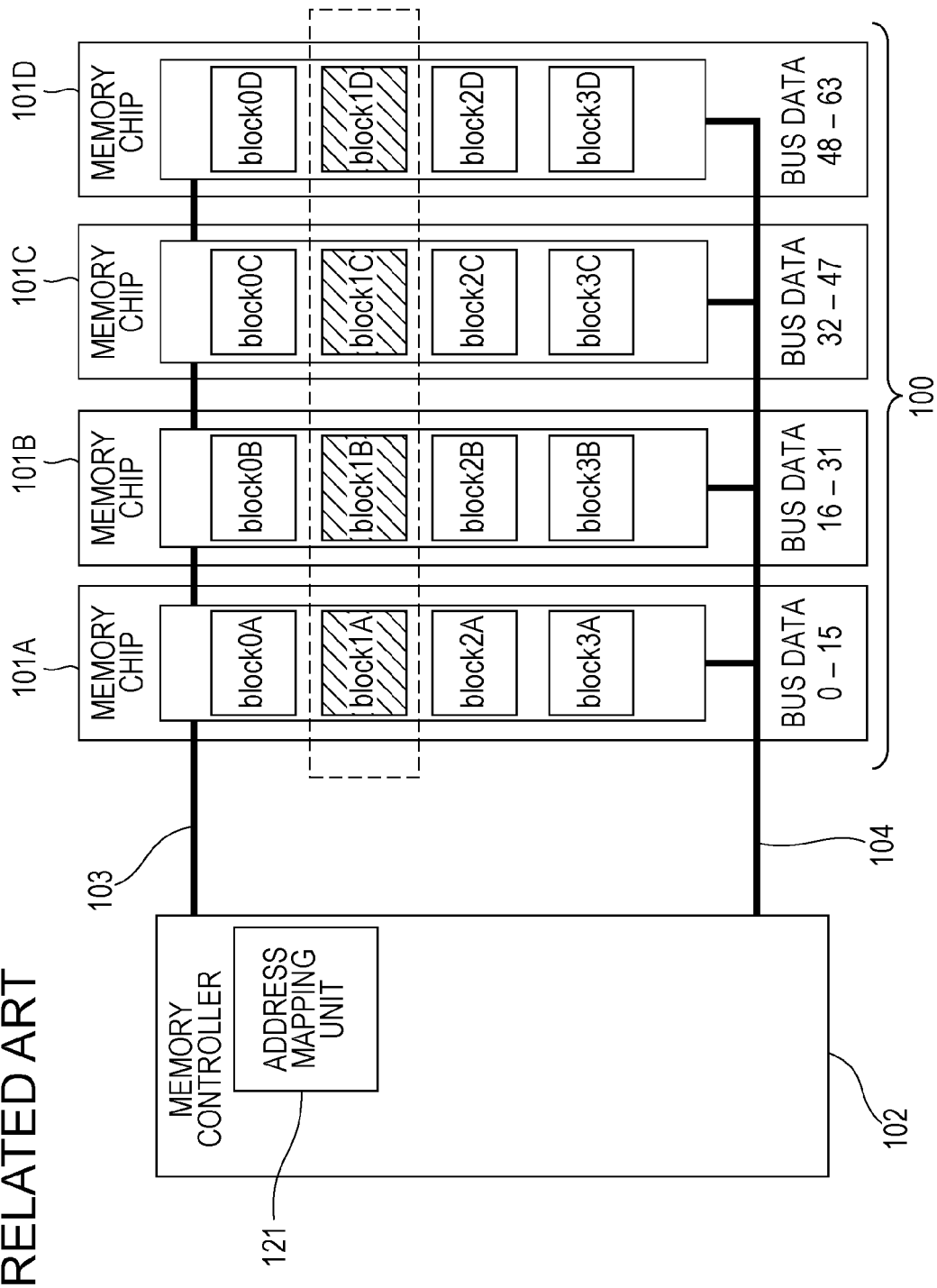

| | CONTROL INPUT | | | | ADDRESS INPUT | |
|---|---|---|---|---|---|---|
| | CS# | RAS# | CAS# | WE# | BA0 – 2 | A0 – An |
| MRS1 – n | L | L | L | L | MR SELECT | OP CODE |
| ACTIVE | L | L | H | H | BA0 – 2 | ROW ADD |
| WRITE | L | H | L | L | BA0 – 2 | COL ADD |
| READ | L | H | L | H | BA0 – 2 | COL ADD |

MEMORY MODULE AND SEMICONDUCTOR STORAGE DEVICE

CROSS-REFERENCE TO RELATED APPLICATION(S)

This application is based upon and claims the benefit of priority of the prior Japanese Patent Application No. 2011-263311, filed on Dec. 1, 2011, the entire contents of which are incorporated herein by reference.

FIELD

The embodiment discussed herein is related to memory modules and semiconductor storage devices.

BACKGROUND

Recently, for example, the through silicon via (TSV) technique is being developed which aims to increase the capacity and the speed of semiconductor storage devices such as dynamic random access memories (DRAMs) and by which multiple DRAM chips (dice) are stacked on top of one another.

In the TSV technique, small holes are made in chips, and the holes are filled with a metal so that the chips are stacked on top of one another. Thus, these layered chips are electrically connected, and are used as a three-dimensional stack package.

Thus, the TSV technique achieves significant reduction in the wiring distance compared to, for example, a case in which multiple memory chips are connected by wire bonding, and therefore has an advantage in terms of increase in speed, power saving, reduction in size, and the like.

Heretofore, various semiconductor storage devices related to the TSV technique have been proposed.

[Patent document] Japanese Laid-open Patent Publications No. 01-076341

[Patent document] Japanese Laid-open Patent Publications No. 03-282652

[Patent document] Japanese Laid-open Patent Publications No. 04-279949

[Patent document] Japanese Laid-open Patent Publications No. 59-161744

[Patent document] Japanese Laid-open Patent Publications No. 2004-206615

As described above, semiconductor integrated circuits have been recently developed in which the TSV technique is used to achieve an increase in the speed, power saving, a reduction in the size, and the like.

In particular, a semiconductor storage device, such as a DRAM or a synchronous DRAM (SDRAM), has layered memory chips which have a common array of, for example, memory cells, achieving an increase in the speed, power saving, a reduction in the size, and the like along with an increase in the transfer rate.

For example, power supply and heat emission, the method for addressing noise or a defective chip, and the like are important for a semiconductor storage device in which three-dimensional packaging is made by applying the TSV technique. Specifically, for example, when layered memory chips are simultaneously activated and operated, a region of high current and heat occurs, resulting in strict operating conditions for the semiconductor storage device.

SUMMARY

According to an aspect of the embodiments, a memory module includes a plurality of memory chips stacked on top of one another, each of the plurality of memory chips including a memory cell unit that is divided into a plurality of blocks, and an address scrambling circuit that processes an input address signal and that selects a block to be operated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a block diagram illustrating an exemplary semiconductor storage device;

DESCRIPTION OF EMBODIMENT

Figure 2A:
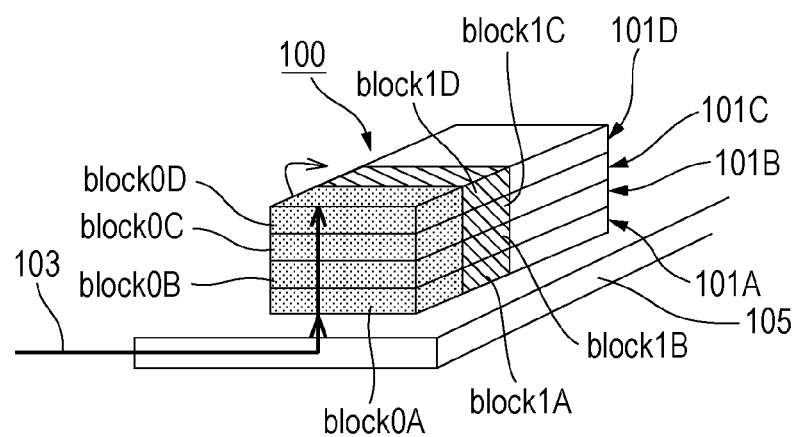
FIGS. 2A and 2B are diagrams for explaining a problem in the semiconductor storage device illustrated in FIG. 1.
Figure 2B:
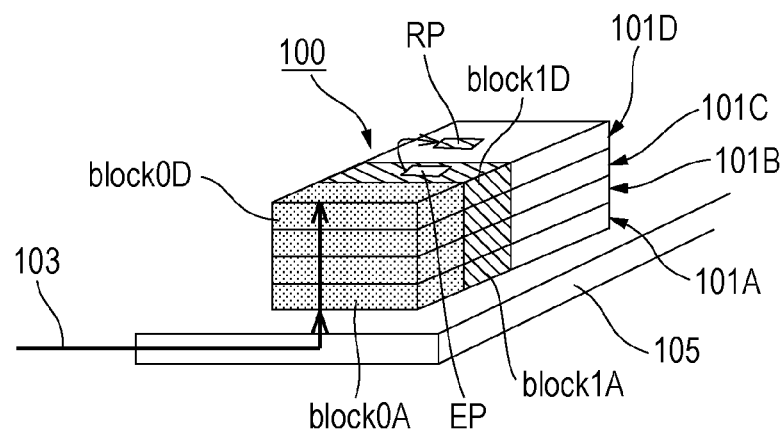

Before detailed description of a semiconductor storage device according to an embodiment, a semiconductor storage device and its problem will be described with reference to FIGS. 1 to 2B. FIG. 1 is a block diagram illustrating an exemplary semiconductor storage device. FIGS. 2A and 2B are diagrams for explaining a problem in the semiconductor storage device illustrated in FIG. 1.

As illustrated in FIG. 1, a semiconductor storage device includes a memory module 100 and a memory controller 102. As illustrated in FIGS. 2A and 2B, the memory module 100 includes four memory chips 101A to 101D which are stacked on top of one another, for example, by using the TSV technique, and is disposed on a substrate 105.

The memory controller 102 includes an address mapping unit 121, and enables, for example, a redundancy process on a defective cell which will be described with reference to FIG. 2B.

Each of the memory chips 101A to 101D has four blocks block0 to block3. That is, the memory chip 101A has blocks block0A to block3A, and the memory chip 101B has blocks block0B to block3B.

Similarly, the memory chip 101C has blocks block0C to block3C, and the memory chip 101D has blocks block0D to block3D. The memory chips 101A to 101D receive a common address signal from the memory controller 102 through an address bus 103.

Each of the memory chips 101A to 101D is connected to the memory controller 102 through a data bus 104, and writing and reading of data are performed on a memory cell selected by an address signal.

In FIG. 1, each of the memory chips 101A to 101D has a data width of 16 bits, and it is possible to write and read 64-bit data simultaneously by using the four memory chips 101A to 101D.

That is, in the semiconductor storage device illustrated in FIGS. 1 to 2B, one word is formed by accessing the four memory chips 101A to 101D simultaneously. Thus, a common address signal is received by the memory chips 101A to 101D.

An address signal from the memory controller 102 is used to access a common position in a selected memory region (operating block) in each of the memory chips 101A to 101D.

Specifically, as illustrated in FIG. 2A, blocks block0A to block0D in the memory chips 101A to 101D are selected as operating blocks for a certain address.

Blocks block1A to block1D in the memory chips 101A to 101D are selected as operating blocks for another address.

Thus, in the memory module 100 including the four memory chips 101A to 101D which are stacked on top of one another by using the TSV technique, blocks located at the same position in the layered memory chips 101A to 101D are selected as operating blocks.

Specifically, the address mapping unit 121 of the memory controller 102 provides a common address signal for all of the memory chips 101A to 101D through the address bus 103. Therefore, even when the address is changed, a local region of high current and heat still occurs.

That is, at a certain time point, since first operating blocks block0A to block0D are selected, a region of high current and heat occurs in the first operating blocks. At the next time point, since second operating blocks block1A to block1D are selected, a region of high current and heat occurs in the second operating blocks.

FIG. 2B illustrates a case in which, for example, an error point EP is present in the block block1D of the memory chip 101D, and illustrates a state in which this error point EP is replaced with a redundancy point RP in another block and the redundancy point RP is used.

In this case, the address mapping unit 121 of the memory controller 102 stores the address of the redundancy point RP which corresponds to the error point EP, and the redundancy point RP is accessed instead of the error point EP.

Thus, as in FIG. 2B, even when the redundancy point RP is used by replacing the error point EP therewith, the operation for the specific error point EP is made in the redundancy point RP in another block. However, most of current and heat occurs in a local region.

As a result, in a semiconductor storage device to which the TSV technique is applied, for example, a local region of high current and heat occurs in the memory module 100, resulting in strict operating conditions for the semiconductor storage device. Instead, when a local region of high heat occurs, the heat has to be dissipated in a manner suitable to the heating state. In addition, when a local region of high current occurs, the wiring line width and the wiring interval have to be widened.

Figure 3:
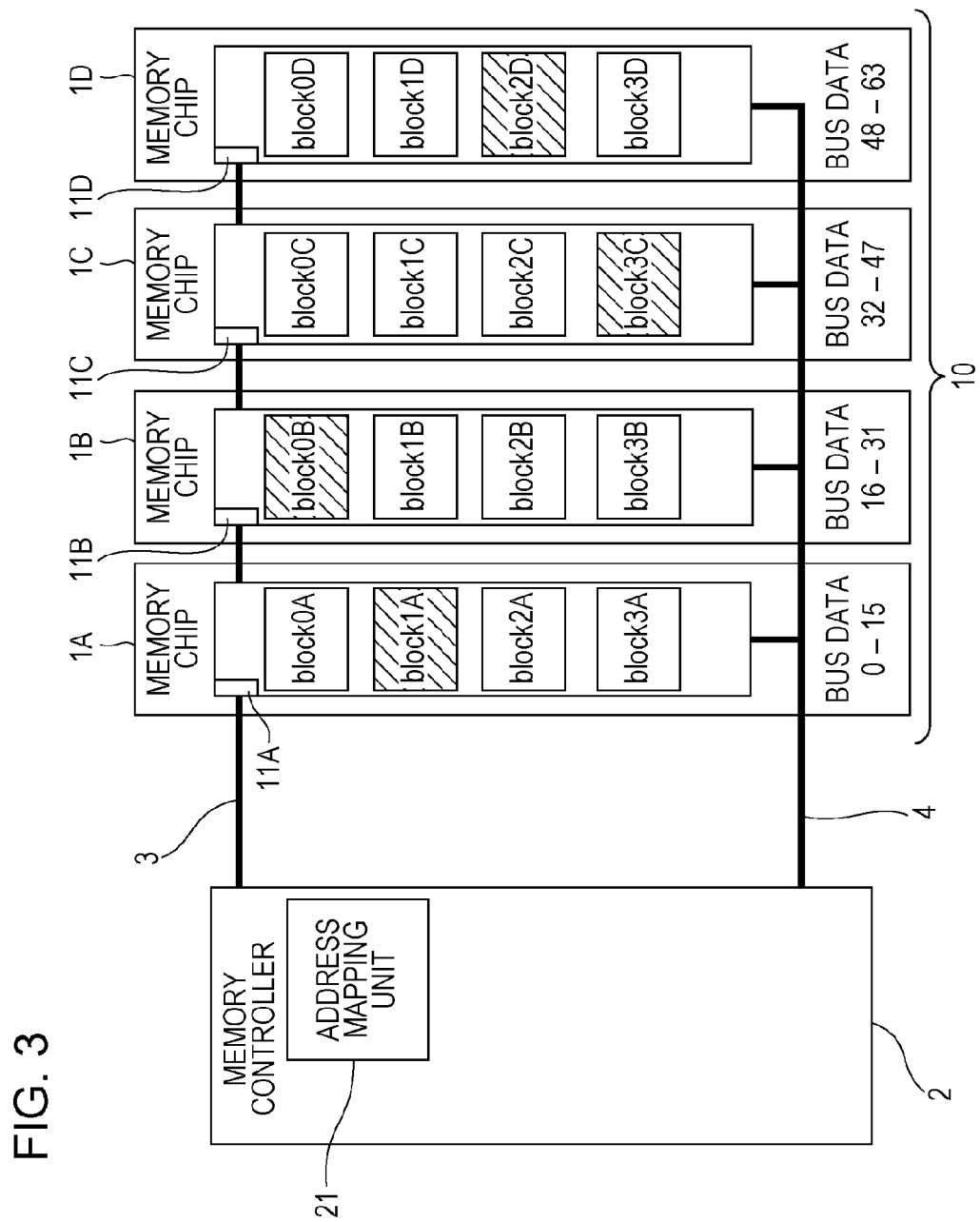
FIG. 3 is a block diagram illustrating a semiconductor storage device according to the present embodiment.
Figure 4:
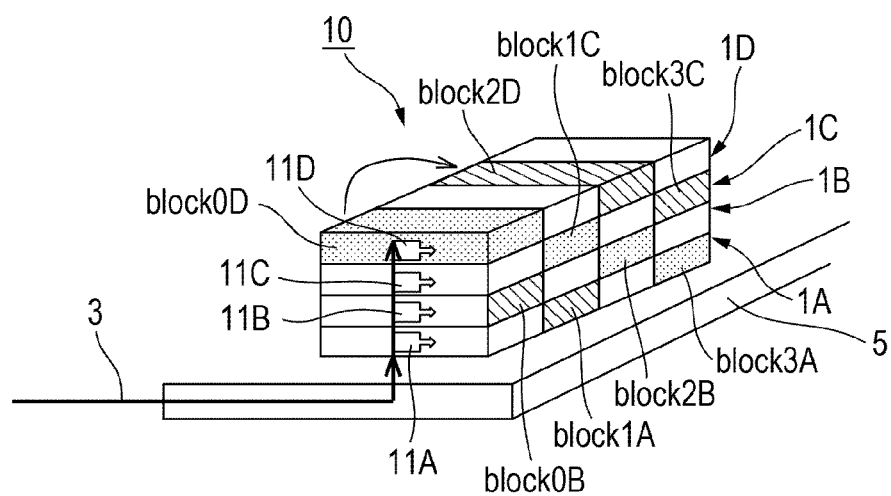
FIG. 4 is a perspective view of the semiconductor storage device illustrated in FIG. 3.

Hereinafter, an embodiment of a memory module and a semiconductor storage device will be described in detail with reference to the accompanying drawings. FIG. 3 is a block diagram illustrating a semiconductor storage device according to the present embodiment. FIG. 4 is a perspective view of the semiconductor storage device illustrated in FIG. 3.

As illustrated in FIG. 3, the semiconductor storage device according to the present embodiment includes a memory module 10 and a memory controller 2. As illustrated in FIG. 4, the memory module 10 includes four memory chips 1A to 1D which are stacked on top of one another, for example, by using the TSV technique, and is disposed on a substrate 5.

The memory controller 2 includes an address mapping unit 21, and enables the redundancy process for a defective cell which is described above with reference to FIG. 2B.

Each of the memory chips 1A to 1D has four blocks block0 to block3. That is, the memory chip 1A has blocks block0A to block3A, and the memory chip 1B has blocks block0B to block3B.

Similarly, the memory chip 1C has blocks block0C to block3C, and the memory chip 1D has blocks block0D to block3D. The memory chips 1A to 1D receive a common address signal from the memory controller 2 through an address bus 3.

Each of the memory chips 1A to 1D is connected to the memory controller 2 through a data bus 4, and writing and reading of data are performed on a memory cell selected by an address signal.

In FIG. 3, each of the memory chips 1A to 1D has a data width of 16 bits, and it is possible to write and read 64-bit data simultaneously by using the four memory chips 1A to 1D.

That is, in the semiconductor storage device illustrated in FIGS. 3 and 4, one word is formed by accessing the four memory chips 1A to 1D simultaneously. Thus, a common address signal is received by the memory chips 1A to 1D.

FIG. 3 illustrates merely an example. The present embodiment is not limited to the configuration illustrated in FIG. 3. That is, the number of memory chips stacked on top of one another by using the TSV technique is not limited to four, and it may be eight or a multiple of eight. In addition, the data width of each of the memory chips may be changed as appropriate.

As illustrated FIGS. 3 and 4, in the semiconductor storage device (memory module) according to the present embodiment, the memory chips 1A to 1D include address scrambling circuits 11A to 11D, respectively.

The address scrambling circuits 11A to 11D receive a logical address from the memory controller 2 through the address bus 3, and change a corresponding physical address in the memory chips 1A to 1D in accordance with a setting from the outside (mode setting) without changing the logical address.

That is, the address scrambling circuits 11A to 11D provided in the memory chips 1A to 1D cause blocks that are located at positions different from each other in the layered memory chips 1A to 1D, to serve as operating blocks that are to be simultaneously accessed.

Specifically, as illustrated in FIG. 4, the block block3A in the memory chip 1A, the block block2B in the memory chip 1B, the block block1C in the memory chip 1C, and the block block0D in the memory chip 1D are selected for a certain address.

Accordingly, the operating blocks for the certain address are blocks block3A, block2B, block1C, and block0D which are dispersedly located at different positions in the layered memory chips 1A to 1D.

In addition, the block block1A in the memory chip 1A, the block block0B in the memory chip 1B, the block block3C in the memory chip 1C, and the block block2D in the memory chip 1D are selected for another address.

Accordingly, operating blocks for the address are blocks block1A, block0B, block3C, and block2D which are dispersedly located at different positions in the layered memory chips 1A to 1D.

Thus, in the memory module 10 including the four memory chips 1A to 1D stacked on top of one another by using the TSV technique, blocks located at different positions are selected as operating blocks in the layered memory chips 1A to 1D.

Therefore, the semiconductor storage device (memory module) according to the present embodiment causes concentration of current and heat to be reduced. This eases the condition demanded for the wiring line width or heat dissipation, and also improves a wide range of choices with respect to the design.

In FIG. 4, for example, when the memory module 10 has eight memory chips stacked on top of one another, sets of two operating blocks may be evenly located when viewed from the top surface of the memory module 10, as blocks (operating blocks) which simultaneously operate.

In this case, even if all of the operating blocks are not evenly located, when, for example, the operating blocks are dispersedly located in the eight memory chips, this achieves an effect of reduction in the concentration of current and heat.

Figure 5:
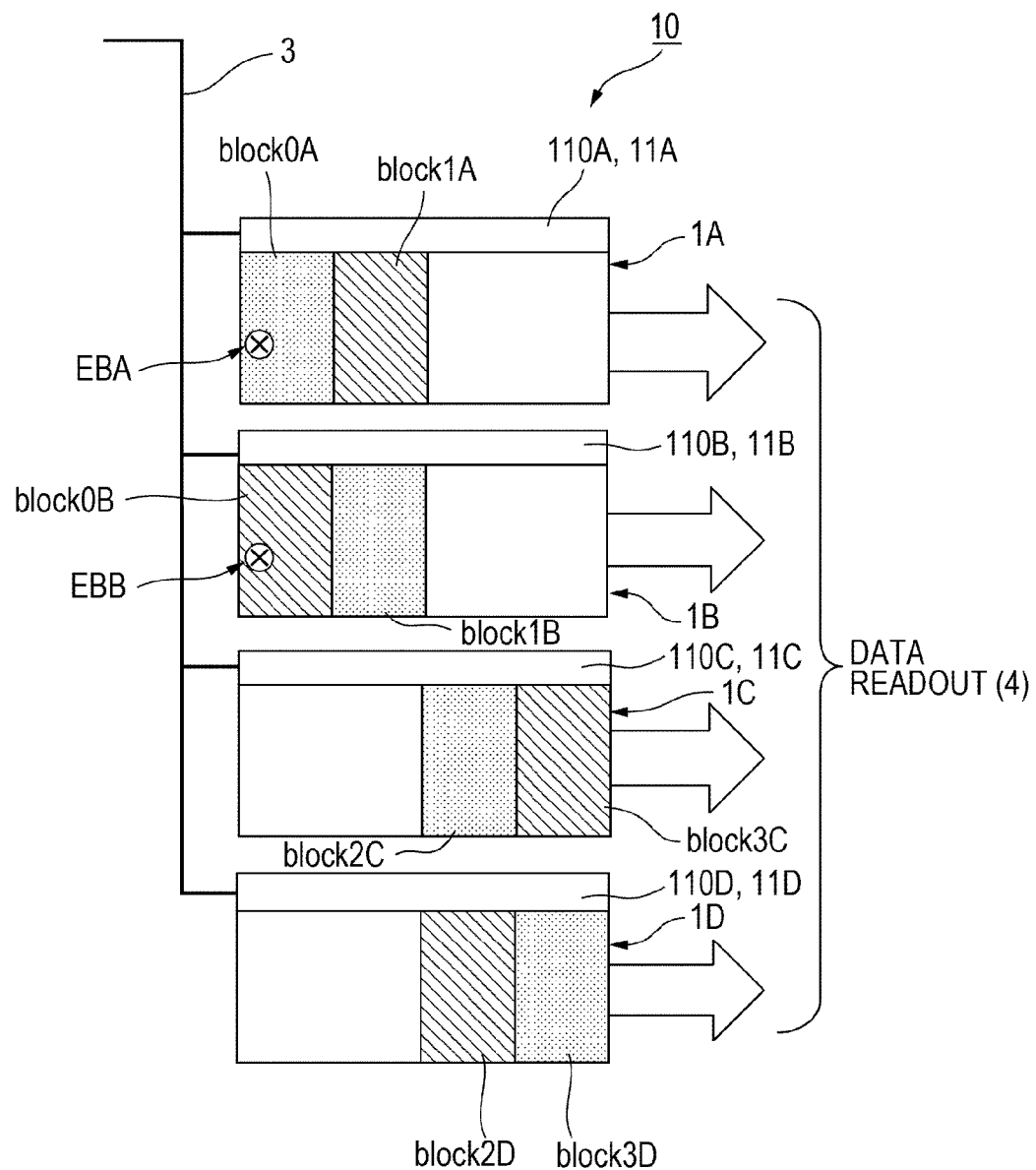
FIG. 5 is a diagram for explaining a further effect in the semiconductor storage device illustrated in FIG. 3.

FIG. 5 is a diagram for explaining a further effect in the semiconductor storage device illustrated in FIG. 3. In FIG. 5, positions of error bits EBA and EBB are illustrated. Circuit portions 110A to 110D are also illustrated which include the above-described address scrambling circuits 11A to 11D and row and column address buffers.

The error bits EBA and EBB indicate bit positions which correspond to a common address signal received through the address bus 3, in the memory chips 1A and 1B.

In the case where the memory controller 2 has an error correction circuit, i.e., an error checking and correcting (ECC) circuit, when, for example, two error bits are included in n bits (n: a natural number) which are to be processed by the ECC circuit, it is not possible to correct the errors.

Accordingly, memory cells, in each of which an error correction has occurred, are recognized using the ECC circuit in advance. For example, if the n bits which are to be subjected to error correction include two memory cells, each of which has an error bit and which are selected in different memory chips by a common address signal, selection of operating blocks is made in such a manner that such two memory cells are not selected at the same time. Thus, even when defective bits are present, such a situation is relieved using the ECC circuit by dispersing the defective bits in the memory chips.

That is, the positions of blocks selected simultaneously in the layered memory chips may be determined in view of not only conditions for reducing the concentration of current and heat but also conditions for defective bits and error correction.

This means that since the address scrambling circuit 11 (a mode register 12) is provided for each of the memory chips 1A to 1D, it is possible to determine positions of blocks which simultaneously operate, in view of not only the concentration of current and heat but also other conditions.

Figure 6A:
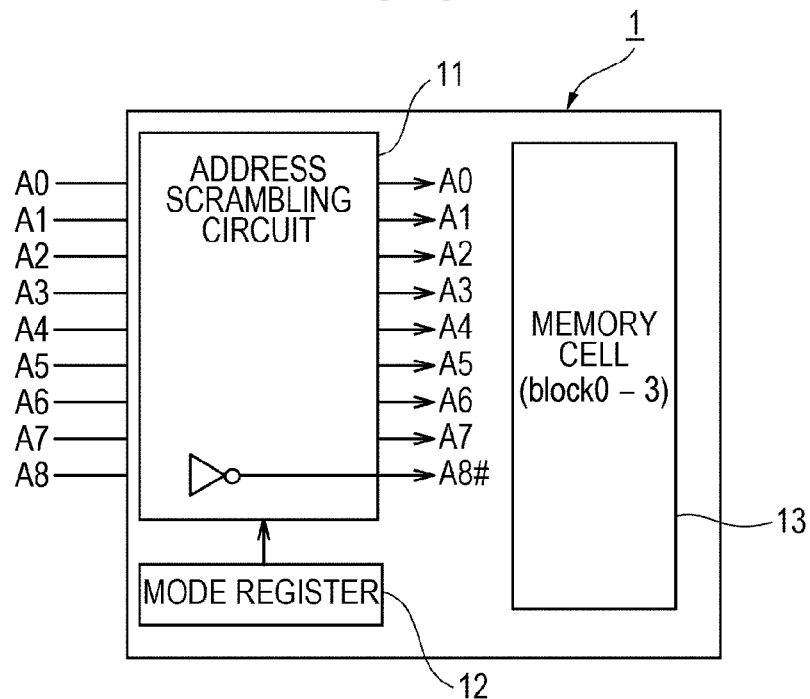
FIGS. 6A and 6B are diagrams for explaining an exemplary address scrambling circuit in the semiconductor storage device illustrated in FIG. 3.
Figure 6B:
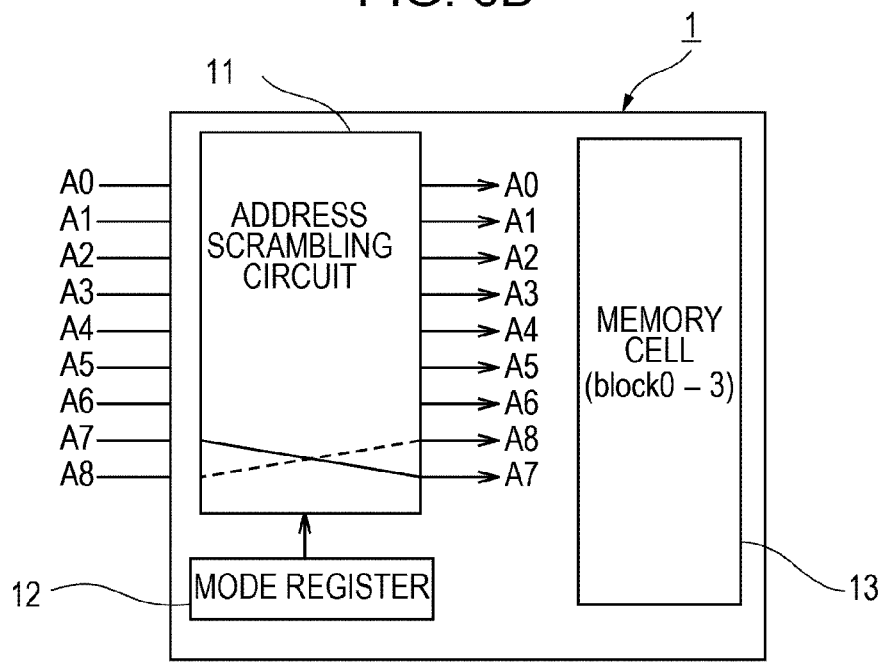

FIGS. 6A and 6B are diagrams for explaining examples of the address scrambling circuit 11 in the semiconductor storage device illustrated in FIG. 3. The address scrambling circuit 11 performs a process as in FIG. 6A or 6B in accordance with a mode which is set to the mode register 12.

That is, as illustrated in FIG. 6A, for example, in the case where a first mode is set to the mode register 12, when the address scrambling circuit 11 receives address signals A0 to A8, the address scrambling circuit 11 reverses the least significant bit A8, and outputs the reversed bit as a bit A8#.

As illustrated in FIG. 6B, for example, in the case where a second mode is set to the mode register 12, when the address scrambling circuit 11 receives address signals A0 to A8, the address scrambling circuit 11 switches the lower two bits A7 and A8, and outputs address signals A0 to A6, A8, and A7.

FIGS. 6A and 6B illustrate merely examples, and various modifications may be made. For example, in the case where the number of memory chips included in the memory module 10 is large and where the number of blocks in each of the memory chips is also large, a lookup table (LAT) may be used in which an input address is associated with an output address for each of multiple modes.

Figures 7A, 7B:
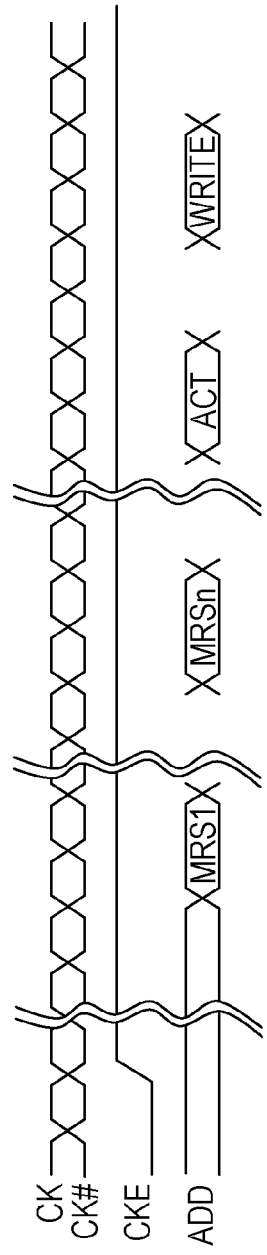
FIGS. 7A and 7B are diagrams for explaining exemplary signals which control the address scrambling circuit illustrated in FIGS. 6A and 6B.

FIGS. 7A and 7B are diagrams for explaining exemplary signals for controlling the address scrambling circuit 11 illustrated in FIGS. 6A and 6B.

As illustrated in FIG. 7A, a mode is set to the mode register 12 in a state in which, for example, all of a chip select signal CS#, a row address strobe signal RAS#, a column address strobe signal CAS#, and a write enable signal WE# indicate a low level 'L'. The symbol '#' indicates that the signal is a low enable signal.

That is, for example, control inputs CS#, RAS#, CAS#, and WE# are set to 'L', and a mode register 12 to which a mode is to be set is selected using bank addresses BA0 to 2. Then, a mode (opcode) is set using address signals A0 to An.

Thus, as illustrated in FIG. 7B, modes are sequentially set to mode registers MR1 to MRn in the memory chips (e.g., mode registers 12 in the memory chips 1A to 1D).

Note that the control using the control inputs CS#, RAS#, CAS#, and WE#, and address inputs BA0 to 2 and A0 to An is used to set normal operation modes, such as ACTIVE for activation, WRITE for writing, and READ for reading.

Figure 8:
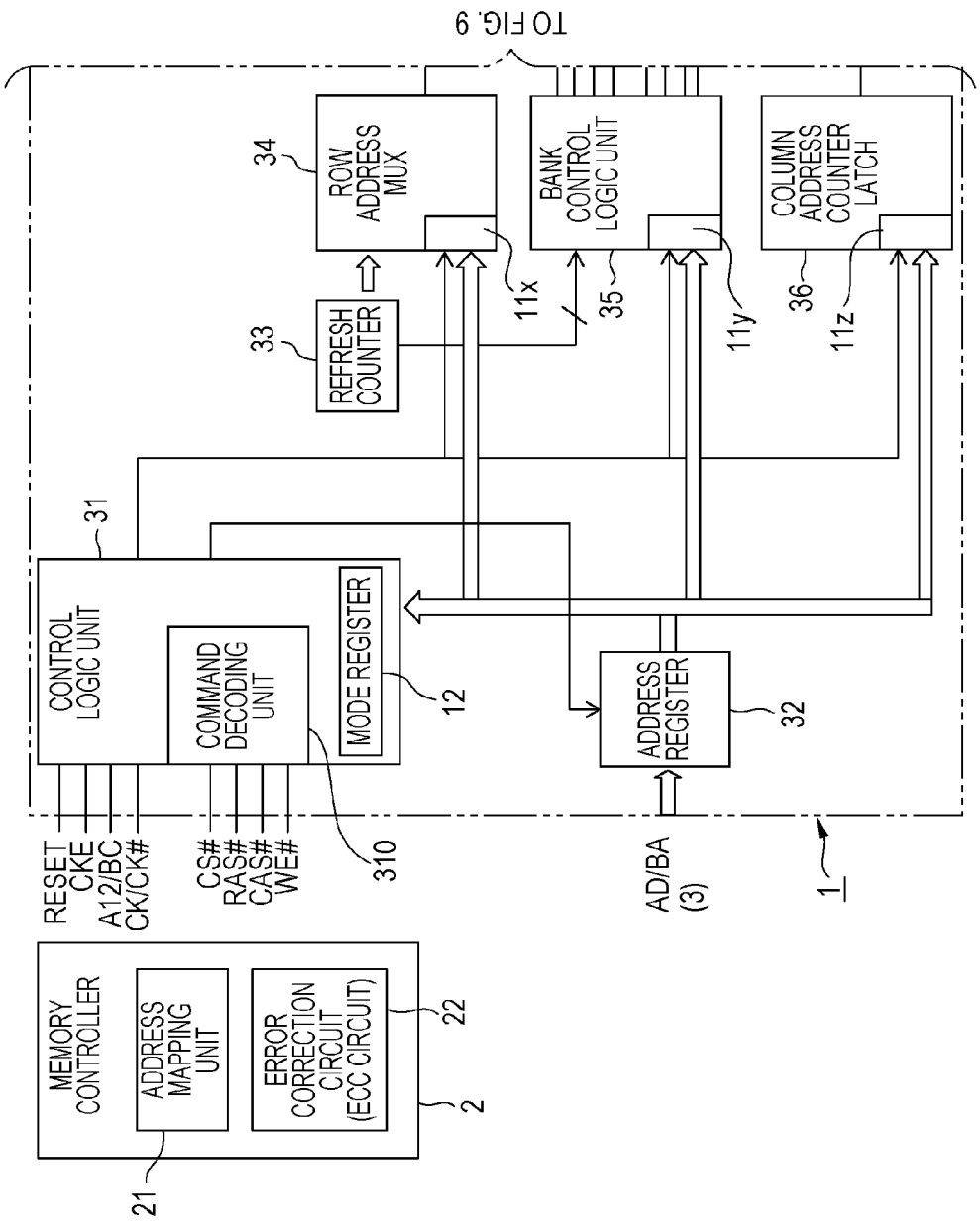
FIG. 8 is a first block diagram illustrating an exemplary memory chip along with a memory controller in the semiconductor storage device illustrated in FIG. 3.
Figure 9:
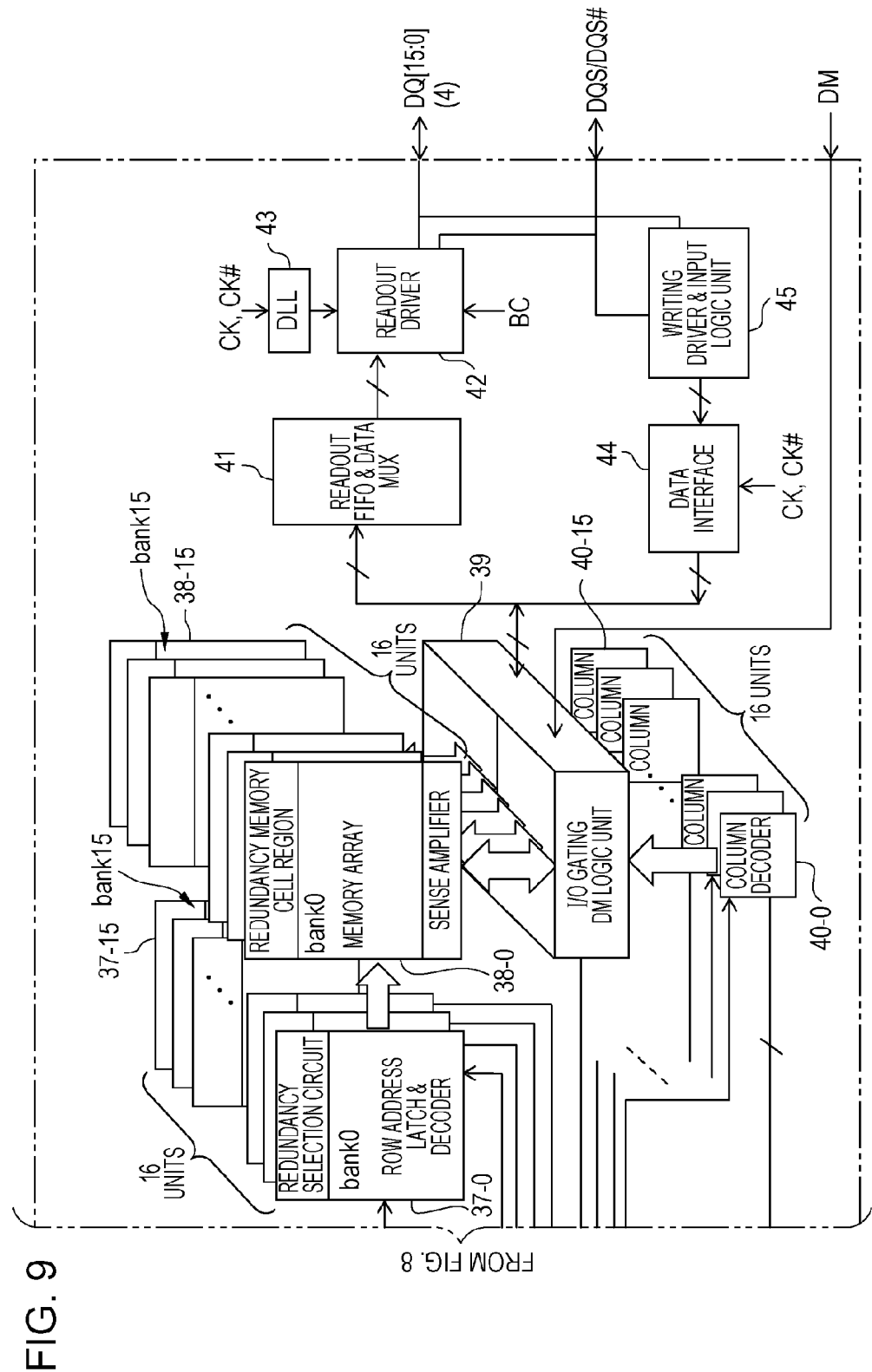
FIG. 9 is a second block diagram illustrating the exemplary memory chip along with the memory controller in the semiconductor storage device illustrated in FIG. 3.

FIGS. 8 and 9 are block diagrams illustrating an exemplary memory chip in the semiconductor storage device illustrated in FIG. 3, along with the memory controller 2. As illustrated in FIGS. 8 and 9, a memory chip 1(1A) in the semiconductor storage device according to the present embodiment includes the mode register 12, and address scrambling circuits 11x, 11y, and 11z.

The reason why the address scrambling circuit is divided into the three address scrambling circuits 11x, 11y, and 11z is that it is preferable to provide an address scrambling circuit for each of circuit blocks in order to process an address signal AD which is converted into addresses for selecting, for example, blocks in which a region of high current and heat does not occur.

The memory controller 2 includes an address mapping unit 21 which associates a logical address with a physical address, and an error correction circuit (ECC circuit) 22 which corrects an error for predetermined target bits. As described above, the memory controller 2 is connected to the memory chip 1 through the address bus 3 and the data bus 4, and provides various control signals for the memory chip 1 to control it.

That is, the memory chip 1 receives an address signal AD and a bank address BA through the address bus 3, and transmits and receives input/output data DQ[15:0] through the data bus 4.

As described with reference to FIGS. 7A and 7B, a mode setting state for the mode register 12 is entered by using the control inputs CS#, RAS#, CAS#, and WE#, and the signals AD/BA are then used to specify which mode register 12 is to be selected for the mode setting and which mode is to be set.

The memory chip 1 includes a control logic unit 31, an address register 32, a refresh counter 33, a row address multiplexer (MUX) 34, a bank control logic unit 35, and a column address counter latch 36. The refresh counter 33 generates a refresh address, and the row address MUX 34 makes a selection between a refresh address and an external address.

The memory chip 1 includes sixteen row address latch and decoders 37-0 to 37-15, sixteen memory arrays 38-0 to 38-15, an I/O gating data mask (DM) logic unit 39, and sixteen column decoders 40-0 to 40-15.

Each of the row address latch and decoders 37-0 to 37-15, the memory arrays 38-0 to 38-15, and the column decoders 40-0 to 40-15 is provided for a corresponding one of banks bank0 to bank15.

Each of the memory arrays 38-0 to 38-15 includes a redundancy memory cell region and a sense amplifier. Each of the row address latch and decoders 37-0 to 37-15 includes a redundancy selection circuit for switching to a backup line in the redundancy memory cell region when a defect is present.

The memory chip 1 further includes a readout first in first out (FIFO) and data multiplexer (MUX) 41, a readout driver 42, a delay locked loop (DLL) 43, a data interface 44, and a writing driver and input logic unit 45.

The readout FIFO and data MUX 41 controls readout data; the readout driver 42 outputs the readout data; and the DLL 43 adjusts the phase. The data interface 44 controls write data. The writing driver and input logic unit 45 is a circuit for receiving write data.

In the memory chip 1 illustrated in FIGS. 8 and 9 described above, the mode register 12 is provided for the control logic unit 31. The address scrambling circuit includes the address scrambling circuit 11x provided for the row address MUX 34, the address scrambling circuit 11y provided for the bank control logic unit 35, and the address scrambling circuit 11z provided for the column address counter latch 36.

The control logic unit 31 includes a command decoding unit 310 which generates commands, and, for example, generates a command for setting a mode to the mode register 12 by using the control inputs as described with reference to FIGS. 7A and 7B.

The command decoding unit 310 receives the chip select signal CS#, the row address strobe signal RAS#, the column address strobe signal CAS#, and the write enable signal WE#.

The control logic unit 31 receives a reset signal RESET, a clock enable signal CKE, an address signal and burst chop (interruption of a burst operation) A12/BC, and a differential clock signal CK/CK#.

The data signal (data input/output) DQ[15:0] is a signal for the memory chip 1A. For example, a data signal DQ[16:31] is for the memory chip 1B; a data signal DQ[32:47] is for the memory chip 1C; and a data signal DQ[48:63] is for the memory chip 1D.

A signal DQS/DQS# is a data strobe signal, and a signal DM is a data mask signal. The memory chip illustrated in FIGS. 8 and 9 is merely an example. The present embodiment may be applied to memory chips having various configurations.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A memory module comprising:
a plurality of memory chips stacked on top of one another, each of the plurality of memory chips including
a memory cell unit that is divided into a plurality of blocks, and
an address scrambling circuit that receives and processes an address signal to select a block to be operated,
wherein the plurality of memory chips receive a common address signal to allow simultaneous access of the plurality of memory chips, and
wherein the address scrambling circuit of each of the plurality of memory chips selects a block, based on the common address signal, in such a manner that the selected blocks operating in the plurality of memory chips stacked on top of one another, respectively, are each located in different memory chips and at different positions of the plurality of memory chips.

2. The memory module according to claim 1,
wherein the memory chip further includes a mode register that stores a mode for specifying a block to be selected by the address scrambling circuit.

3. The memory module according to claim 2,
wherein the address scrambling circuit has a plurality of mode patterns each of which is used to associate a different block with the input address signal, and
wherein the mode register stores a mode for selecting any one of the plurality of mode patterns.

4. The memory module according to claim 1,
wherein, when pieces of error data are output from a first memory cell selected in a first memory chip of the plurality of memory chips and from a second memory cell selected in a second memory chip of the plurality of memory chips, the first and second memory cells being associated with the common address signal, the address scrambling circuit selects a second block including the second memory cell in the second memory chip in such a manner that the second block is associated with an address signal different from an address signal for a first block including the first memory cell in the first memory chip.

5. A semiconductor storage device comprising:
a memory module including:
a plurality of memory chips stacked on top of one another, each of the plurality of memory chips including
a memory cell unit that is divided into a plurality of blocks, and
an address scrambling circuit that receives and processes an address signal to select a block to be operated; and
a memory controller that provides the address signal for each of the memory chips in the memory module and that controls reading and writing of data,
wherein the plurality of memory chips receive a common address signal to allow simultaneous access of the plurality of memory chips, and
wherein the address scrambling circuit of each of the plurality of memory chips selects a block, based on the common address signal, in such a manner that the selected blocks operating in the plurality of memory chips stacked on top of one another, respectively, are each located in different memory chips and at different positions of the plurality of memory chips.

6. A semiconductor storage device comprising:
a memory module;
a memory controller that provides an address signal for a plurality of memory chips in the memory module and that controls reading and writing of data,
wherein the memory module includes:
- the plurality of memory chips stacked on top of one another, each of the plurality of memory chips including
- a memory cell unit that is divided into a plurality of blocks, and
- an address scrambling circuit that receives and processes an input address signal to select a block to be operated, wherein the plurality of memory chips receive a common address signal to allow simultaneous access of the plurality of memory chips by the memory controller, and
wherein the address scrambling circuit of each of the plurality of memory chips selects a block in such a manner that the selected blocks operating in the plurality of memory chips stacked on top of one another, respectively, are dispersedly located,
wherein, when pieces of error data are output from a first memory cell selected in a first memory chip of the plurality of memory chips and from a second memory cell selected in a second memory chip of the plurality of memory chips, the first and second memory cells being associated with the common address signal, the address scrambling circuit selects a second block including the second memory cell in the second memory chip in such a manner that the second block is associated with an address signal different from an address signal for a first block including the first memory cell in the first memory chip,
wherein the memory controller includes an error correction circuit that corrects an error in n bits, where n is a natural number, the n bits being collectively formed by outputs of the plurality of memory chips,
wherein the memory controller recognizes in advance whether or not the first memory cell and the second memory cell that are associated with the common address signal are included in the n bits to be subjected to error correction by the error correction circuit, and
wherein, when the first memory cell and the second memory cell that are associated with the common address signal are included in the n bits to be subjected to error correction by the error correction circuit, the address scrambling circuit selects a second block including the second memory cell in the second memory chip in such a manner that the second block is associated with an address signal different from an address signal for a first block including the first memory cell in the first memory chip.

* * * * *